United States Patent
Yamada (10) Patent No.: US 6,313,536 B1
(45) Date of Patent: *Nov. 6, 2001

(54) SEMICODUCTOR DEVICE HAVING A MULTILAYERED INTERCONNECTION STRUCTURE

(75) Inventor: Yoshiaki Yamada, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,849

(22) Filed: Apr. 8, 1998

(30) Foreign Application Priority Data

Apr. 8, 1997 (JP) .................................................... 9-089231

(51) Int. Cl.[7] ............................ H01L 23/48; H01L 23/52; H01L 29/40
(52) U.S. Cl. ........................ 257/758; 257/775; 438/638
(58) Field of Search ................................. 257/758, 775; 438/622, 637, 638

(56) References Cited

U.S. PATENT DOCUMENTS

| 5,462,893 | 10/1995 | Matsuoka et al. | 437/195 |
| 5,543,360 | 8/1996 | Matsuoka et al. | 437/195 |
| 5,679,608 | * 10/1997 | Cheung et al. | 438/622 |
| 5,773,892 | * 6/1998 | Morikawa et al. | 257/758 |
| 5,883,434 | * 3/1999 | Noguchi | 257/750 |
| 6,016,012 | * 1/2000 | Chatila et al. | 257/775 |
| 6,130,482 | * 10/2000 | Iio et al. | 257/774 |

FOREIGN PATENT DOCUMENTS

| 2-58228 | 2/1990 | (JP) . |
| 4-226054 | 9/1992 | (JP) . |

OTHER PUBLICATIONS

Zhao, B., "A Novel Sub–Half Micron Al–Cu Via Plug interconnect Using Low Dielectric Constant Material as Inter–Level Dielectric", IEEE Electron Device Letters, Vol. 18, No. 2, pp. 57–9 Feb. 1997.*

* cited by examiner

*Primary Examiner*—Olik Chaudhuri
*Assistant Examiner*—Howard Weiss
(74) *Attorney, Agent, or Firm*—Foley & Lardner (57) ABSTRACT

A semiconductor device having a multilayered interconnection structure comprises a wiring pattern (15) composed of a main wiring metal (13) having a forward-tapered shape and a subsidiary wiring metal (14) of a high-melting-point metal formed on side surfaces of the main wiring metal (13). The wiring pattern (15) as a whole has a width substantially equal to that of a bottom end of the main wiring metal (13). After a silicon oxide film (16) is deposited, a through hole (160) is formed in the silicon oxide film (16). The width of the through hole (160) at its bottom is greater and smaller than those of the upper surface and the lower surface of the main wiring metal (13), respectively.

35 Claims, 7 Drawing Sheets

SEMICODUCTOR DEVICE HAVING A MULTILAYERED INTERCONNECTION STRUCTURE

BACKGROUND OF THE INVENTION

This invention relates to a semiconductor device and, in particular, to a semiconductor device having a multilayered interconnection structure.

As one approach to highly-integrated and high-speed semiconductor devices, a multilayered interconnection (or wiring) structure is adopted in which upper and lower wiring patterns in upper and lower wiring layers are connected via a through hole formed in an interlayer (or intermediate) insulator film between the wiring layers. In a conventional semiconductor device having such a multilayered interconnection structure, the through hole has a width narrower than that of the lower wiring pattern. With this structure, the through hole is prevented from overstepping the lower wiring pattern even in occurrence of a positioning error of the through hole or a variation in process condition. Thus, degradation in reliability and decrease in yield are avoided.

However, there is a standing demand for more and more integrated semiconductor devices. To this end, a line pitch must further be narrowed. Under the circumstances, there is no room to maintain the above-mentioned structure that the lower wiring pattern is wider than the through hole Rather, the through hole and the lower wiring pattern are rendered equal in width to each other because restriction is imposed upon narrowing the through hole. This means that no margin is reserved in positioning the through hole with respect to the lower wiring pattern. In this event, the through hole tends to overstep the lower wiring pattern. If the through hole oversteps the lower wiring pattern, the interlayer insulator film of silicon oxide is undesirably exposed and etched in a portion adjacent to a side surface of the lower wiring pattern during the formation of the through hole. In addition, an underlying silicon oxide film under the lower wiring layer is etched also. As a consequence, leakage of electric current may occur between the upper or the lower wiring pattern and a silicon substrate under the underlying silicon oxide film or another wiring pattern of polysilicon or suicide. In the worst case, short-circuiting is caused to occur. This results in degradation in reliability and decrease in yield.

Taking the above into consideration, it is proposed to form a protection film on the side surfaces of the lower wiring pattern. During formation of the through hole, etching slightly beyond a predetermined position where the through hole is to be formed is stopped by presence of the protection film. For example, such technique is disclosed in Japanese Unexamined Patent Publication (JP-A) No. 226054/1992. With this structure, not only the portion of the interlayer insulator film adjacent to the side surface of the lower wiring pattern but also the underlying silicon oxide film under the lower wiring pattern are completely prevented from being erroneously etched. In the above-mentioned publication, the protection film comprises amorphous silicon. Alternatively, the protection film may comprise a high-melting-point metal, such as W and MO, or silicide thereof. The high-melting-point metal or silicide thereof serves to improve a stress migration resistance and an electromigration resistance in case where the lower wiring pattern comprises an Al alloy. The protection film comprising the high-melting-point metal or its compound is disclosed, for example, in Japanese Unexamined Patent Publication (JP-A) No. 58228/1990.

However, the above-mentioned prior art technique is disadvantageous in the following respects.

At first, when the above-mentioned structure has a width narrower than that of the lower wiring pattern as mentioned above, a connection resistance inevitably becomes high.

This is because, following the improvement of a highly integrated structure of the semiconductor device, the through hole becomes finer and smaller in sectional area.

Secondly, when the protection film is formed on the side surfaces of the lower wiring pattern, leak current may possibly occur if the line pitch is narrow. In the worst case, short-circuiting is caused to occur.

This is because, forming the protection film of a conductive material on the side surfaces of the lower wiring pattern is substantially equivalent to widening the lower wiring pattern in correspondence to the thickness of the protection film. In other words, the line pitch is substantially narrowed.

SUMMARY OF THE INVENTION

It is a general object of this invention to provide a semiconductor device having a multilayered interconnection structure which is capable of preventing a decrease in reliability and yield even if a wiring pattern and a through hole are minimized following the improvement of a highly-integrated structure of the semiconductor device.

It is a specific object of this invention to provide a semiconductor device having a multilayered interconnection structure which is capable of preventing a through hole from overstepping a wiring pattern even if the through hole has a width substantially equal to that of the wiring pattern which is capable of avoiding an increase in connection resistance of the through hole.

According to a first aspect of this invention, there is provided a semiconductor device having a multilayered interconnection structure and comprising a first wiring pattern including a main wiring metal having a forward-tapered cross-section, an interlayer insulator film covering the first wiring pattern, an opening formed in the interlayer insulator film to expose at least a part of side walls of the main wiring metal and an upper surface of the main wiring metal, a conductor layer filled in the opening, and a second wiring pattern formed on the interlayer insulator file to be connected to the conductor layer.

According to a second aspect of this invention, there is provided a semiconductor device having a multilayered interconnection structure and comprising a first wiring pattern including a main wiring metal having a forward-tapered cross-section, an interlayer insulator film covering the first wiring pattern, an opening formed in the interlayer insulator film to expose at least a part of side walls of the main wiring metal and an upper surface of the main wiring metal, and a second wiring pattern formed in the opening and on the interlayer insulator film to be connected to the main wiring metal.

According to a second aspect of this invention, there is provided a semiconductor device comprising a first wiring pattern, an interlayer insulator film covering the first wiring pattern and having a through hole leading to the first wiring pattern, and a second wiring pattern formed on the interlayer insulator film to be connected to the first wiring pattern, wherein the first wiring pattern comprises a main wiring metal and a subsidiary wiring metal. The main wiring metal has a forward-tapered cross-section so that the main wiring metal is narrowed in width from a bottom end towards an upper end in a thickness direction thereof. The subsidiary wiring metal covers side surfaces of the main wiring metal and having outer side surfaces substantially parallel to a depth direction of the through hole. The first wiring pattern has, as a whole, a width substantially equal to that of a bottom end of the main wiring metal.

DESCRIPTION OF THE PREFERRED EMBODIMENTS

In order to facilitate an understanding of this invention, conventional semiconductor devices having a multilayered wiring structure will at first be described with reference to the drawing.

As one approach to highly-integrated and high-speed semiconductor devices, a multilayered interconnection structure is adopted in which upper and lower wiring patterns in upper and lower wiring layers are connected via a through hole formed in an interlayer insulator film between the wiring layers.

Figure 1:
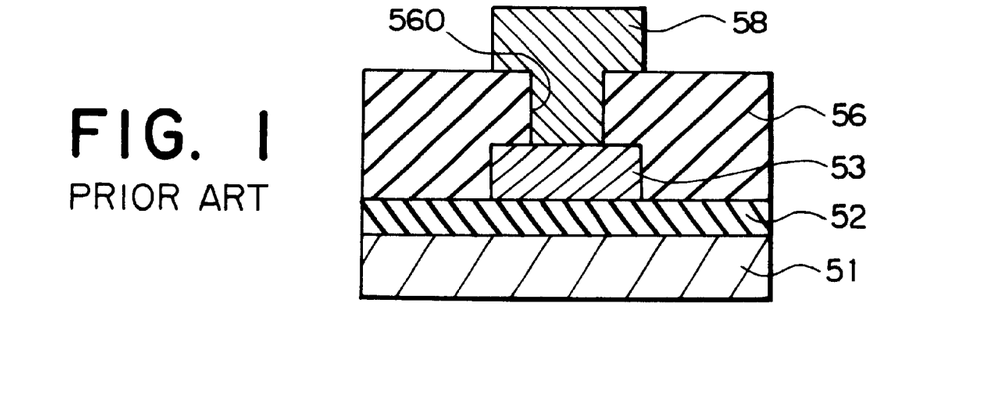
FIG. 1 is a sectional view of a conventional semiconductor device.

At first referring to FIG. 1, a conventional semiconductor device of a multilayered interconnection structure comprises a silicon substrate 51, a lower silicon oxide film 52, a lower wiring pattern 53, an intermediate silicon oxide film 56 as an interlayer insulator film, and an upper wiring pattern 58. The upper and the lower wiring patterns 58 and 53 formed in upper and lower wiring layers are mutually connected via a through hole 560 formed in the intermediate silicon oxide film 56. The through hole 560 has a width narrower than that of the lower wiring pattern 53. With this structure, the through hole 560 is prevented from overstepping the lower wiring pattern 53 even in occurrence of a positioning error of the through hole 560 or a variation in process. Thus, degradation in reliability and decrease in yield are avoided.

However, there is a standing demand for more and more integrated semiconductor devices. To this end, a line pitch must further be reduced. Under the circumstances, there is no room to maintain the above-mentioned structure that the lower wiring pattern is wider than the through hole. Rather, the through hole and the lower wiring pattern are rendered equal in width to each other because restriction is imposed upon narrowing the through hole. This means that no margin is reserved in positioning the through hole with respect to the lower wiring pattern. In this event, the through hole tends to overstep the wiring pattern.

Figure 2:
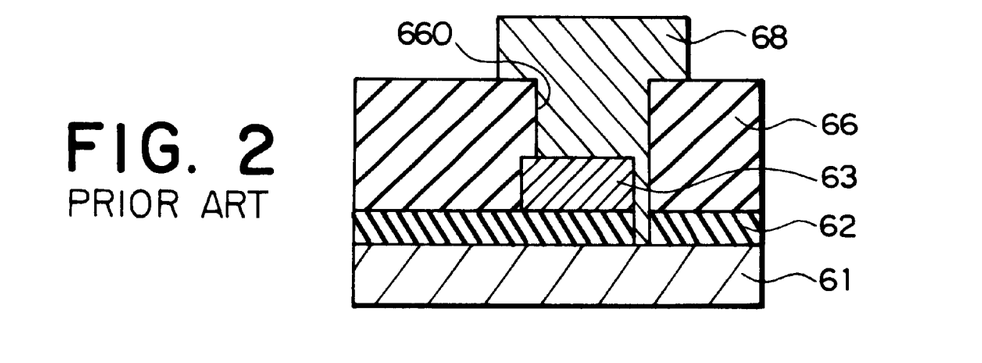
FIG. 2 is a sectional view of another conventional semiconductor device.

Referring to FIG. 2, another conventional semiconductor device comprises a silicon substrate 61, a lower silicon oxide film 62, a lower wiring pattern 63, an intermediate silicon oxide film 66 as an interlayer insulator film, and an upper wiring pattern 68. The upper and the lower wiring patterns 68 and 63 are mutually connected via a through hole 660 formed in the intermediate silicon oxide film 66. Herein, the through hole 660 is equal in width to the lower wiring pattern 63. If the through hole 660 is formed offset from the lower wiring pattern 63 as shown in FIG. 2, the intermediate silicon oxide film 66 is undesirably exposed and etched in a portion adjacent to a side surface of the lower wiring pattern 63 during the formation of the through hole 660. In addition, the lower silicon oxide film 62 under the lower wiring layer 63 is etched also. As a consequence, leakage of electric current may occur between the upper or the lower wiring pattern 68 or 63 and the silicon substrate 61 under the lower silicon oxide film 62 or another wiring pattern of polysilicon or silicide (not shown). In the worst case, short-circuiting is caused to occur. This results in degradation in reliability and decrease in yield.

Taking the above into consideration, it is proposed to form a protection film on the side surface of the lower wiring pattern. Such structure is disclosed, for example, in Japanese Unexamined Patent Publication (JP-A) No. 226054/1992 and will hereinafter be described.

Figure 3:
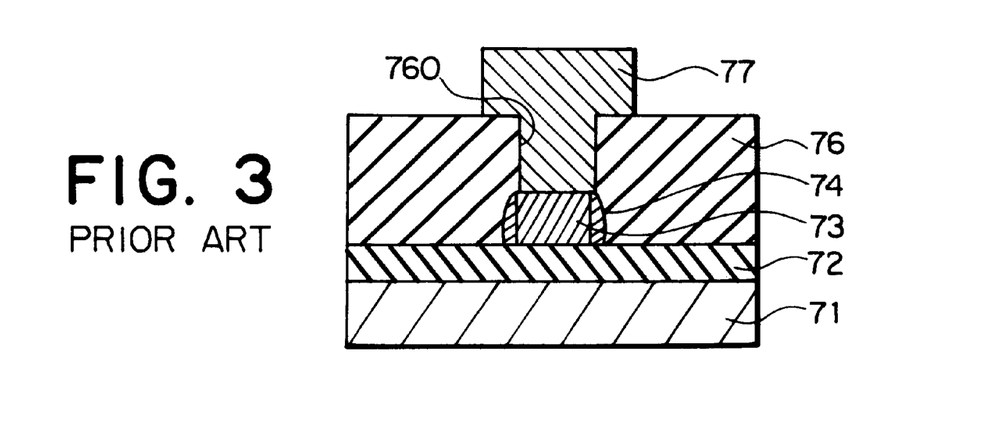
FIG. 3 is a sectional view of still another conventional semiconductor device.

Referring to FIG. 3, a conventional semiconductor device of the type comprises a silicon substrate 71, a lower silicon oxide film 72, a lower wiring pattern 73, an intermediate silicon oxide film 76 as an interlayer insulator film, and an upper wiring pattern 77. The upper and the lower wiring patterns 77 and 73 are mutually connected via a through hole 760 formed in the intermediate silicon oxide film 76. A protection film 74 is formed on side surfaces of the lower wiring pattern 73. With this structure, etching slightly beyond a predetermined position where the through hole 760 is to be formed is stopped by presence of the protection film 74. Therefore, not only the portion of the intermediate silicon oxide film 76 adjacent to one of the side surfaces of the lower wiring pattern 73 but also the lower silicon oxide film 72 below the lower wiring pattern 73 are completely prevented from being erroneously etched. In the above-mentioned publication, the protection film 74 comprises amorphous silicon. Alternatively, the protection film 74 may comprise a high-melting-point metal, such as W and Mo, or silicide thereof. The high-melting-point metal or suicide thereof serves to improve a stress migration resistance and an electromigration resistance in case Where the lower wiring pattern 73 comprises an Al alloy. The protection film 74 comprising the high-melting-point metal or its compound is disclosed, for example, in Japanese Unexamined Patent Publication (JP-A) No. 58228/1990.

Now, description will be made about several embodiments of this invention with reference to the drawing.

Figure 4:
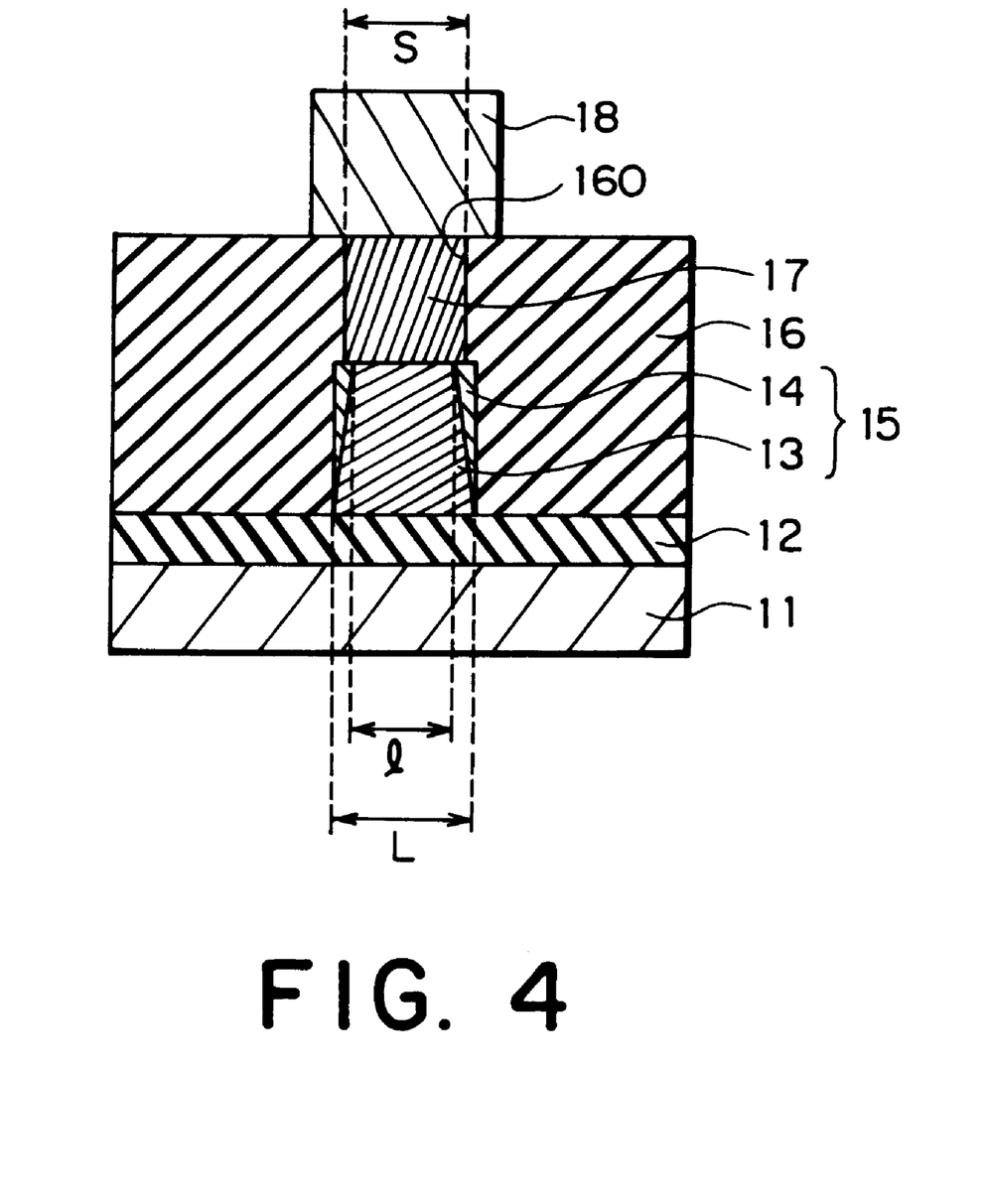
FIG. 4 is a sectional view of a semiconductor device according to a first embodiment of this invention.

Referring to FIG. 4, a semiconductor device having a multilayered interconnection structure according to a first embodiment of this invention comprises a silicon substrate 11 with device regions (not shown) formed therein, a lower silicon oxide film 12 covering an upper surface of the silicon substrate 11, and a first wiring pattern 15 formed on the lower silicon oxide film 12. The first wiring pattern 15 comprises an Al alloy film 13 (a main wiring metal) formed in a forward-tapered shape and a high-melting-point metal film or a high-melting-point metal compound film 14 (a subsidiary wiring metal) formed on both side surfaces of the Al alloy film 13. The first wiring pattern 15 has side surfaces substantially perpendicular to the upper surface of the silicon substrate 11. An intermediate silicon oxide film 16 as an interlayer insulator film between the lower wiring pattern 15 and an upper wiring pattern 18 (which will later be described) is formed on the lower silicon oxide film 12 to cover the side surfaces and an upper surface of the first wiring pattern 15. The intermediate silicon oxide film 16 has a planarized upper surface. At a desired position of the intermediate silicon oxide film 16, a through hole 160 is formed to lead to the first wiring pattern 15. The through hole 160 has a width (depicted at S in the figure) which is greater and smaller than those of a top end (l) and a bottom end (L) of the main wiring metal 13, respectively. With this structure, the through hole 160 is prevented from overstepping the first wiring pattern 15. The through hole 160 is filled with a conductor metal 17 of a high-melting-point metal. The second wiring pattern 18 of an Al alloy is formed on the conductor metal 17.

Next, a process of manufacturing the semiconductor device according to the first embodiment will be described with reference to FIGS. 5A through 5E and 6A through 6D.

Figure 5A:
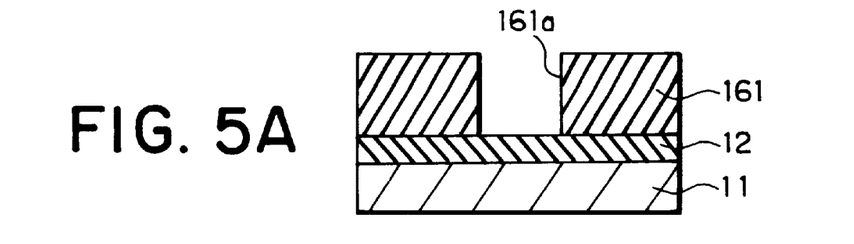
FIGS. 5A through 5E are sectional views for describing a first half of a process of manufacturing the semiconductor device illustrated in FIG. 4.

At first referring to FIG. 5A, the silicon substrate 11 with the device regions (not shown) is covered with the lower silicon oxide film 12 formed thereon. On the lower silicon oxide film 12, a first intermediate silicon oxide film 161 as a first half of the intermediate silicon oxide film 16 in FIG. 4 is formed to a thickness corresponding to that of the first wiring pattern 15. Then, a groove 161a is formed in the first intermediate silicon oxide film 161 at a position where the first wiring pattern 15 is to be formed. It is noted here that the groove 161a has a rectangular section and side walls substantially perpendicular to the upper surface of the silicon substrate 11. A silicon nitride film (not shown) may be formed under the first intermediate silicon oxide film 161 so as to automatically stop etching beyond a predetermined position where the groove 161a is to be formed.

Next referring to FIG. 5B, the high-melting-point metal film such as Ti, N, Mo, and Cr, or the high-melting-point metal compound film such as TiN, WN, MoN, TiW, WSi$_x$, MoSi$_x$, and TiSi$_x$ (hereinafter will collectively be referred to as the high-melting-point metal film 14) is deposited by sputtering. During sputtering, the silicon substrate 11 in inclined with respect to a sputter target so that the high-melting-point metal film 14 is deposited on the side walls of the groove 161a with a gradient. Specifically, the high-melting-point metal film 14 is not substantially deposited on the side walls of the groove 161a around its bottom end and gradually increased in deposition thickness towards its top end. Thus, the subsidiary wiring metal film 14 formed on the side walls of the groove 161a has a thickness which is greatest at the top end of the groove 161a and becomes smaller towards the bottom end of the groove 161a.

Figure 5B:
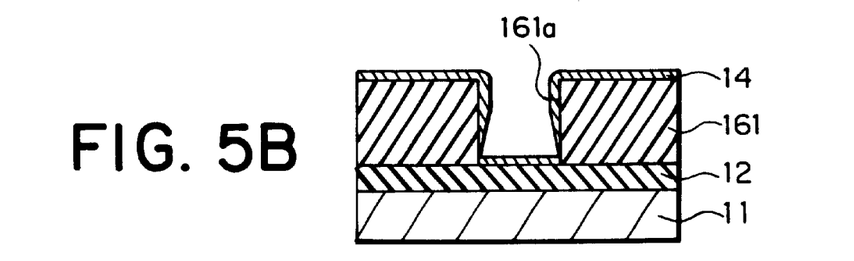
Figure 5C:
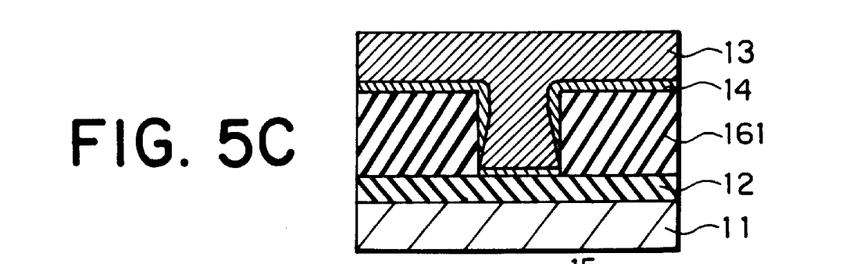

Turning to FIG. 5c, the Al alloy film 13 is deposited by sputtering. During the sputtering, the silicon substrate 11 is heated to fluidize the Al alloy film 13 being deposited by sputtering so that the groove 161a is filled with the Al alloy film 13.

Figure 5D:
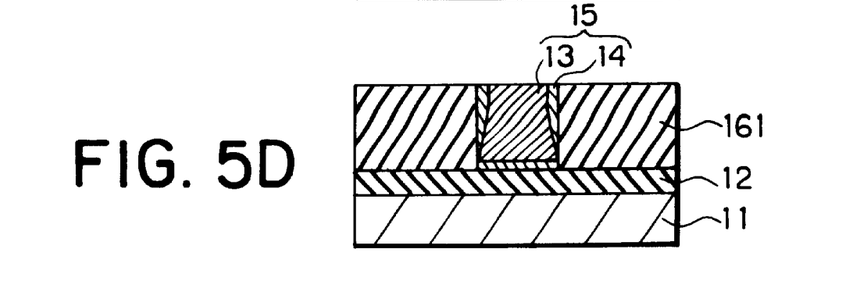

Referring to FIG. 5D, the Al alloy film 13 and the high-melting-point metal film 14 an the first intermediate silicon oxide film 161 are polished by chemical mechanical polishing (CMP) so that the Al alloy film 13 and the high-melting-point metal film 14 are left within the groove 161. By further polishing, the upper surface of the first intermediate silicon oxide film 161 is planarized. As a result, the groove 161a is filled with the first wiring pattern 15 comprising the Al alloy film 13 and the high-melting-point metal film 14 as the main and the subsidiary wiring metals.

Figure 5E:
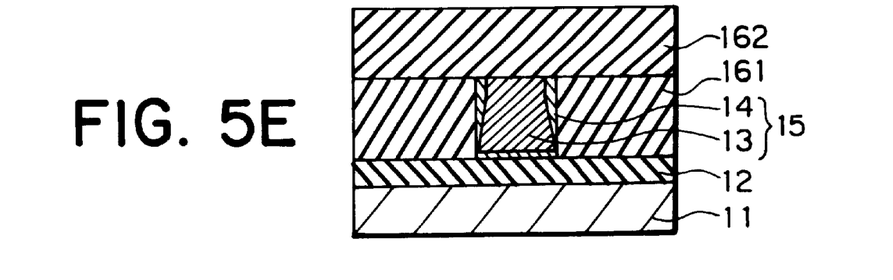

As illustrated in FIG. 59, a second intermediate silicon oxide film 162 is formed by chemical vapor deposition (CVD) as a second half of the intermediate silicon oxide film 16 in FIG. 4.

Figure 6A:
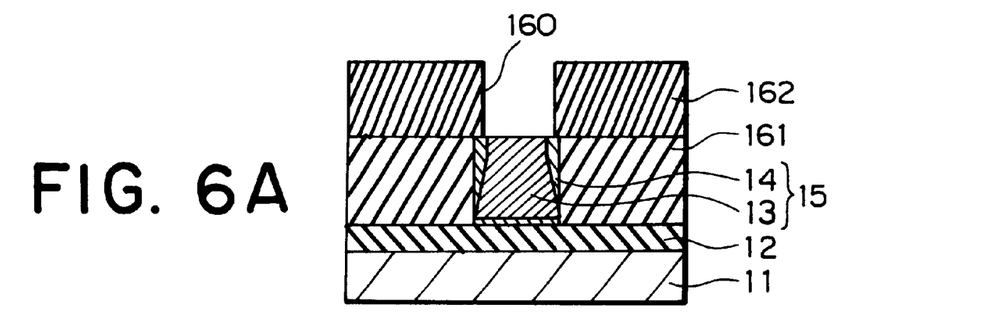
FIGS. 6A through 6D are sectional views for describing a latter half of the process.

Turning to FIG. 6A, the through hole 160 is formed at a desired position of the second intermediate silicon oxide film 162 to lead to the Al alloy film or the main wiring metal 13. The width of the through hole 160 in a widthwise direction of the first wiring pattern 15 greater and smaller than those of the top end and the bottom end of the main wiring metal 13. With this structure, the through hole 160 is prevented from overstepping the first wiring pattern 15.

Figure 6B:
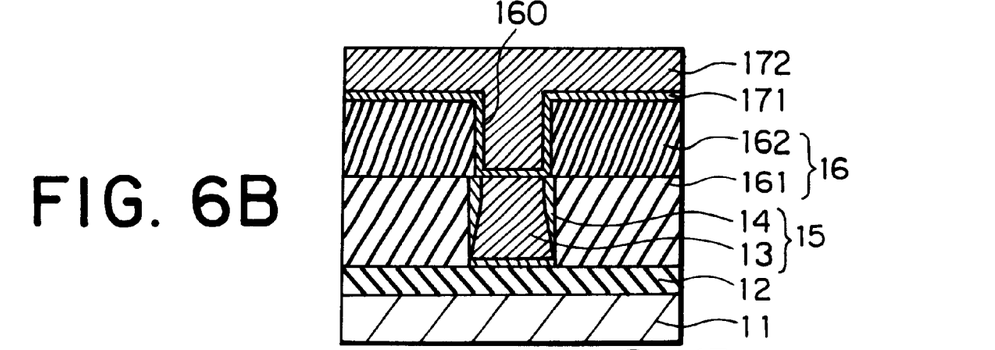

Referring to FIG. 6B, a second high-melting-point metal film 171 as a part of the conductor metal 17 in FIG. 4 is deposited by ordinary sputtering to a small thickness. On the second high-melting-point metal film 171, a third high-melting-point metal film 172 as the other part of the conductor metal 17 is deposited by low pressure CVD (LPCVD) which is excellent in coverage of a stepped surface. The through hole 160 is filled with the third high-melting-point metal film 172.

Figure 6C:
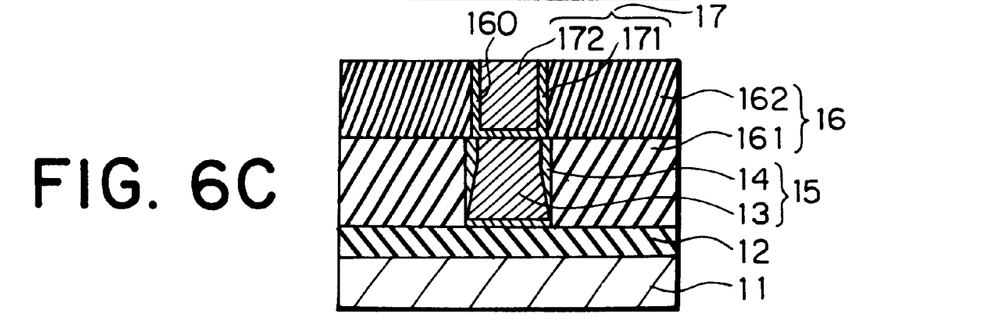

Referring to FIG. 6C, the third and the second high-melting-point metal films 172 and 171 are etched by dry etching until an upper surface of the second intermediate silicon oxide film 162 is exposed. As a result, the second and the third high-melting-point metal films 171 and 172 are left only in the through hole 160 to serve as the conductor metal 17 comprising a mass of the high-melting-point metal.

Figure 6D:
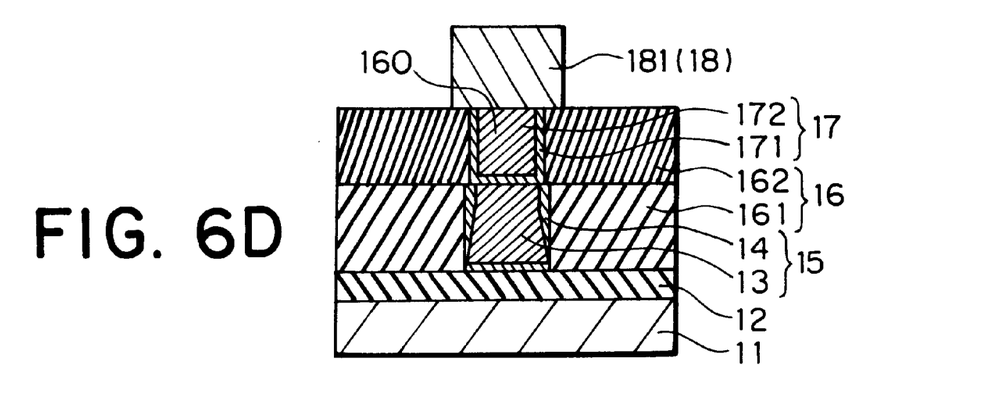

Turning to FIG. 6D, an Al alloy film 181 is deposited by sputtering and then patterned into a desired shape to serve as the second wiring pattern 18. Thus, a two-layered interconnection structure comprising the Al alloy wiring patterns 13 and 18 is completed.

Turning back to FIG. 4, the operation of the semiconductor device having a multilayered interconnection structure of this embodiment will be described.

At a junction between the conductor metal film or the high-melting-point metal film 17 and the first wiring pattern 15, electric current mainly flows through an upper part of the main wiring metal or the Al alloy film 13. In addition, electric current also flows through an area adjacent to each side surface of the Al alloy film 13, via the subsidiary wiring metal or the high-melting-point metal film 14. On the surface of the Al alloy film 13, alumina and other deposit produced during dry etching for the purpose of forming the through hole 160 are adhered. These deposits may possibly increase a connection resistance directly between the Al alloy film 13 and the high-melting eg-point metal film 17. On the other hand, a connection resistance between the high-melting-point metal films 14 and 17 does not become high. Therefore, the connection resistance on the side surface of the Al alloy film 13 is stable because the high-melting-point metal film 14 is interposed between the Al alloy film 13 and the high-melting-point metal film 17. Thus, as compared with the case where the high-melting-point metal film 14 is not formed on the side surfaces of the Al alloy film 13 and the upper part of the Al alloy film 13 alone is connected to the high-melting-point metal film 17, a total connection resistance between the first wiring pattern 15 and the high-melting-point metal film 17 is low and stable in this embodiment because the side surfaces of the Al alloy film 13 are also connected to the high-melting-point metal film 17 via the high-melting-point metal film 14.

Let the widths of the top end of the Al alloy film 13, the bottom end of the Al alloy film 13, and the bottom end of the through hole 160 in the widthwise direction of the first wiring pattern 15 be represented by l, L, and S, respectively. In this embodiment, the relationship l<S is kept so that the side surfaces of the Al alloy film 13 and the high-melting-point metal film 17 are reliably connected via the high-melting-point metal film 14. In addition, the relationship L>S is kept so that the through hole 160 is prevented from overstepping the first wiring pattern 15 even if the through hole 160 is formed offset from the first wiring pattern 15 by an allowance up to (L−S2).

In order to easily embody the first embodiment, description will be made more in detail, reciting specific numerical values.

Again referring to FIG. 5A, the silicon substrate 11 with the device regions (not shown) is covered with the lower silicon oxide film 12 formed thereon. On the lower silicon oxide film 12, the first intermediate silicon oxide film 161 is deposited to the thickness on the order of 0.5 $\mu$m corresponding to that of the first wiring pattern 15. Thereafter, the groove 161a is formed in the first intermediate silicon oxide film 161 at the position where the first wiring pattern 15 is to be formed. In order to make the groove 161a have the rectangular section, the both side walls of the groove 161a are perpendicular to the upper surface of the silicon substrate 11.

The silicon nitride film (not shown) may be formed under the first intermediate silicon oxide film 161 to serve as an etch stopper film. Specifically, in order to form the groove 161a, the first intermediate silicon oxide film 161 is subjected to dry etching by the use of an etching gas comprising a mixture of $C_4F_8$ and CO. If the silicon nitride film is formed as described above, the etching is stopped by the silicon nitride film so that the groove 161a is accurately formed with excellent controllability.

Then, referring to FIG. 5B, a tungsten film as the high-melting-point metal film 14 is deposited by sputtering to a thickness of 100 nm. During the sputtering, the silicon substrate 11 is inclined at 45' with respect to the sputter target and rotated. In this manner, the tungsten film 14 deposited on each of the side walls of the groove 161a is very thin at the bottom end of the groove 161a because that portion is hidden behind a peripheral portion of the groove 161a. As a result, the tungsten film 14 deposited on each side wall has a thickness of 100 nm at the top end of the groove 161a and becomes thinner towards the bottom end of the groove 161a. Assuming that the groove 161a has a width of 0.4 $\mu$m, the tungsten film 14 formed on each side wall of the groove 161a at the bottom end is as thin as 10 nm or less. Thus, the tungsten film 14 is not substantially deposited at the bottom end.

Turning to FIG. 5C, an AlCu alloy film containing 0.5% Cu added to Al is deposited as the Al alloy film 13. Specifically, the AlCu alloy film 13 is at first deposited to a thickness on the order of 0.2 $\mu$m in the condition where the silicon substrate 11 is kept at a temperature not higher than 100° C. Then, the silicon substrate 11 is heated to a temperature around 400° C. thereafter, a deposition rate is reduced to 0.2 $\mu$m/min to form the AlCu alloy film 13 to a thickness of 0.4 $\mu$m. At this time, the AlCu alloy film 13 is fluidized to completely fill the groove 161a.

Referring to FIG. 5D, the AlCu alloy film 13 is polished by CMP by the use of a slurry containing fine particles of silica until the tungsten film 14 is exposed. Then, by the use of a slurry containing fine particles of alumina, the tungsten film 14 is polished until the upper surface of the first intermediate silicon oxide film 161 is exposed. In, this manner, the AlCu alloy film 13 and the tungsten film 14 are left only within the groove 161a to serve as the first wiring pattern 15.

Referring to FIG. 5E, the second intermediate silicon oxide film 162 is deposited by plasma CVD. The second intermediate silicon oxide film 162 has a thickness required as an interlayer insulator film interposed between the first and the second wiring patterns 15 and 18. Herein, the thickness is equal to 0.8 $\mu$m.

Referring to FIG. 6A, the through hole 160 is formed in the second intermediate silicon oxide film 162 by ordinary photolithography and dry etching to lead to the first wiring pattern 15. The width of the through hole 160 in the widthwise direction of the first wiring pattern 15 is equal to 0.3 $\mu$m at its bottom end. Accordingly, if the through hole 160 is accurately positioned, the tungsten film 14 is exposed at each side of the AlCu alloy film 13 by the width of 0.05 $\mu$m. The through hole 160 has a square plan in this embodiment. However, the size of the through hole 160 in a lengthwise direction of the first wiring pattern 15 is not specifically limited.

Next referring to FIG. 6B, another tungsten film is deposited as the second high-melting-point metal film 171 to the thickness of 50 nm. Thereafter, by the LPCVD in which tungsten hexafluoride ($WF_6$) is reduced by hydrogen, still another tungsten film is deposited as the third high-melting-point metal film 172 to the thickness of 0.4 $\mu$m. The through hole 160 is filled with the tungsten film 172.

As illustrated in FIG. 6C, the tungsten films 171 and 172 are etched throughout an overall surface until the upper surface of the second intermediate silicon oxide film 162 is exposed. An a result, the tungsten films 171 and 172 are left only in the through hole 160.

Instead of dry etching, the tungsten films 171 and 172 on the second intermediated silicon oxide film 162 may be removed by CMP using the slurry containing alumina fine particles.

Referring to FIG. 6D, an AlCu alloy film with 0.5% Cu added to Al is deposited by sputtering as the Al alloy film 181 to the thickness on the order of 0.8 $\mu$m. Thereafter, by ordinary lithography and dry etching, the AlCu alloy film 181 is patterned into a desired shape to serve an the second wiring pattern 18. Through the above-mentioned steps, the two-layered interconnection structure comprising the Al alloy wiring patterns is completed.

Continuously referring to FIG. 6D, the operation and the effect of this embodiment will be described.

At the junction between the tungsten films 171 and 172 and the first wiring pattern 15, electric current mainly flows through the upper part of the AlCu alloy film 13. Also through the area adjacent to each side surface of the AlCu alloy film 13, electric currents flows via the tungsten film 14. Since the tungsten film 171 and the tungsten film 14 are identical in material, the connection resistance therebetween is low. Therefore, the total connection resistance can be reduced in correspondence to a large connection area between the AlCu alloy film 13 and the tungsten film 14. For example, it is assumed that the through hole has a 0.3 $\mu$m square plan. In case where only the upper part of the AlCu alloy film as the first wiring pattern is connected to the tungsten film 17 as in the prior art, the connection resistance is approximately equal to 4Ω. On the other hand, the connection resistance is equal to about 3Ω in this embodiment. Thus, It is possible according to this embodiment to reduce the connection resistance.

As illustrated in FIG. 6A, the AlCu alloy film 13 is exposed at the bottom of the through hole 160. In this event, alumina may be formed on the upper surface of the AlCu alloy film 13. Furthermore, the deposit resulting from overetching of the second intermediate silicon oxide film 162 during formation of the through hole 160 may be adhered to the AlCu alloy film 13. Therefore, if the upper surface of the AlCu alloy film 13 alone is connected to the tungsten film 17, the connection resistance will be increased and, in the worst case, line interruption occurs. On the other hand, the side surfaces of the AlCu alloy film 13 is also connected to the tungsten film 17 via the tungsten film 14 in this embodiment. Therefore, even if the connection resistance at the upper surface of the AlCu alloy film 13 is high, the connection resistance is low in total. Thus, the line interruption is avoided.

In this embodiment, the first wiring pattern 15 has a width of 0.4 $\mu$m and the through hole 160 has a width of 0.3 $\mu$m. Therefore, ever it the through hole 160 is positioned offset from the first wiring pattern 15 by a gap up to 0.05 $\mu$m, the through hole 160 is prevented from overstepping the first wiring pattern 15.

As described above, the tungsten film 14 is formed on each of the side surfaces of the AlCu alloy film 13. However, the side wall of the tungsten film 14 is perpendicular to the upper surface of the silicon substrate 11 and the first wiring pattern 15 as a whole has the width equal to that of the bottom end of the AlCu alloy film 13. Therefore, no short-circuiting occurs.

As compared with the prior art in which the side surfaces of the AlCu alloy film itself are vertical, the AlCu alloy film 13 in this embodiment has the forward-tapered shape and is therefore smaller in sectional area than that of the prior art. As a result, a wire resistance of the AlCu alloy film 13 itself in this embodiment is increased by 10–15% as compared with the prior art. However, the increase of 1$\Omega$ or more in resistance of the wiring pattern having the width of 0.4 $\mu$m and the thickness of 0.5 $\mu$m requires that the length of the wiring pattern is equal to 50 $\mu$m or more. Thus, if the wiring pattern is segmented by 50 $\mu$m and if each segmented portion contains at least one through hole, the overall resistance of the wiring pattern is lower in this embodiment than in the prior art. Furthermore, in case where the width and the thickness of the wiring pattern are great, the increase in resistance is smaller in this embodiment than in the prior art.

The increase in wire resistance in this embodiment is not local but is uniform throughout the entire length. Therefore, the operation of the semiconductor device is hardly inhibited as compared with the prior art in which the wire resistance is locally increased at the portion of the through hole.

In response to the stress of the interlayer insulator film, a defect occurs on the side surface of the AlCu alloy film 13. This phenomenon is called a stress migration. In particular, the stress is often concentrated to a corner of the upper part of the wiring pattern to cause the defect. In this embodiment, the tungsten film 14 is formed on the side surface of the AlCu alloy film 13 and is thicker towards the upper part of the side surface. The tungsten film 14 serves to relax the above-mentioned stress so that no defect due to the stress migration is caused in the first wiring pattern 15.

Figure 7A:
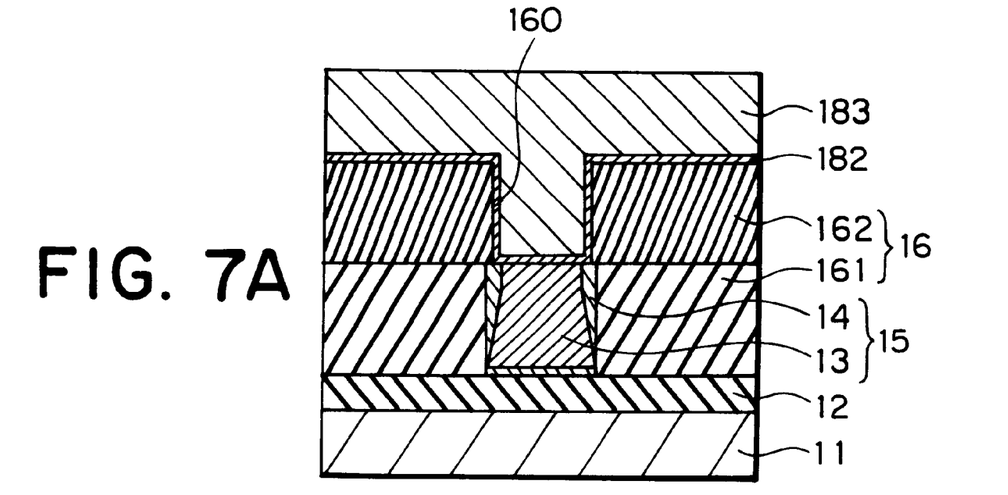
FIGS. 7A and 7B are sectional views for describing a process of manufacturing a semiconductor device according to a second embodiment of this invention.

Now, description will be made about a semiconductor device having a multilayered wiring structure according to a second embodiment of this invention. The second embodiment is a modification of the first embodiment. Specifically, a series of steps similar to those illustrated in FIGS. 5A through 5E and 6A are carried out until the first wiring pattern 15 is formed and then the through hole 160 is formed at a desired position of the second intermediate silicon oxide film 162 to lead to the first wiring pattern 15. Thereafter, as illustrated in FIG. 7A, a titanium film 182 is deposited by sputtering to a thickness between 10 and 50 nm. Without exposing the titanium film 182 to air, an Al alloy film 183 is successively formed by sputtering to a thickness between 100 and 200 nm in the condition of the deposition rate of about 1 $\mu$m/mm and the deposition temperature of 100° C. or less. After the silicon substrate 11 is heated to a temperature between 350 and 400° C. the Al alloy film 183 is successively formed by sputtering to a thickness between 0.5 and 0.8 $\mu$m at the deposition rate between 0.1 and 0.2 $\mu$m/min. Because the temperature during formation of the tatter part of the Al alloy film 183, the Al alloy film 183 being deposited is fluidized so that the through hole 160 is filled with the Al alloy film 183.

Figure 7B:
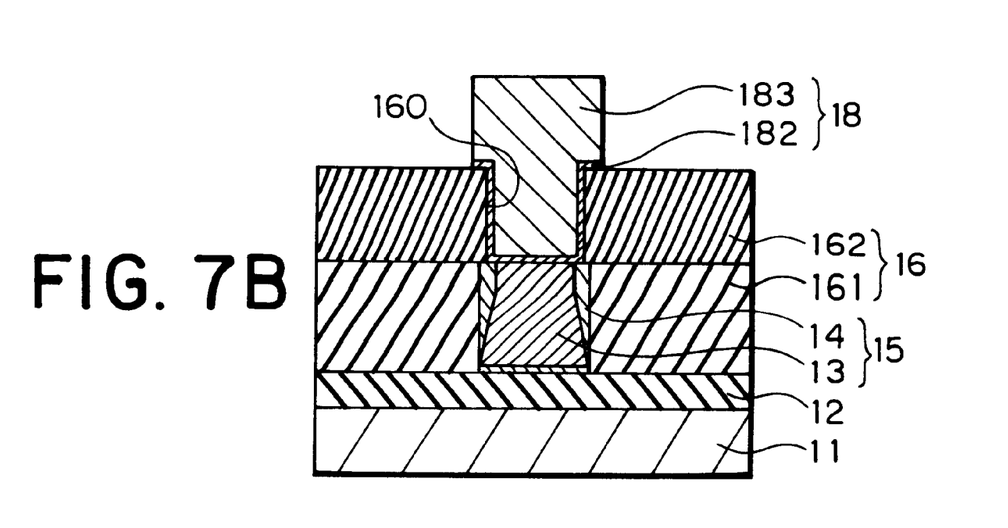

Referring to FIG. 7B, the Al alloy film 183 and the titanium film 182 are patterned by ordinary lithography and dry etching. Thus, the second wiring pattern 18 is formed.

In this embodiment, the through hole 160 is filled with the Al alloy film 183 having a low resistance and the connection resistances between the titanium film 182 and the Al alloy film 13 and between the titanium film 182 and the tungsten film 14. Therefore, as compared with the first embodiment in which the tungsten films 171 and 172 are filled in the through hole 160, the first wiring pattern 15 and the second wiring pattern 18 can be connected with a lower resistance.

Figure 8A:
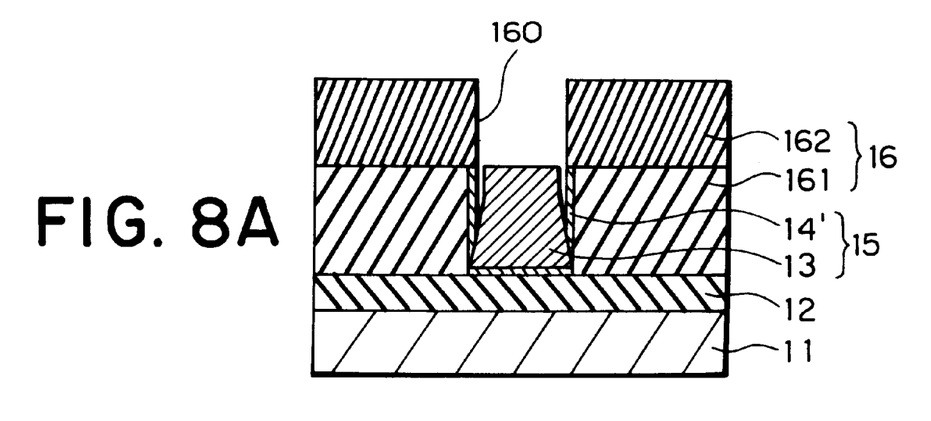
FIGS. 8A through 8C are sectional views for describing a process of manufacturing a semiconductor device according to a third embodiment of this invention.
Figure 8B:
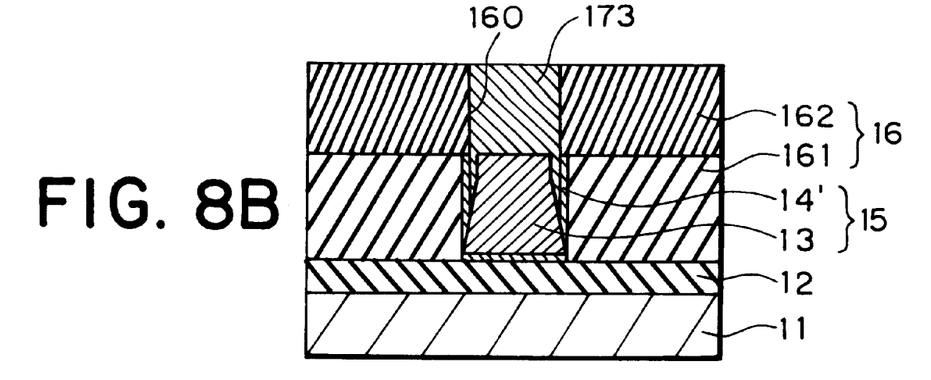
Figure 8C:
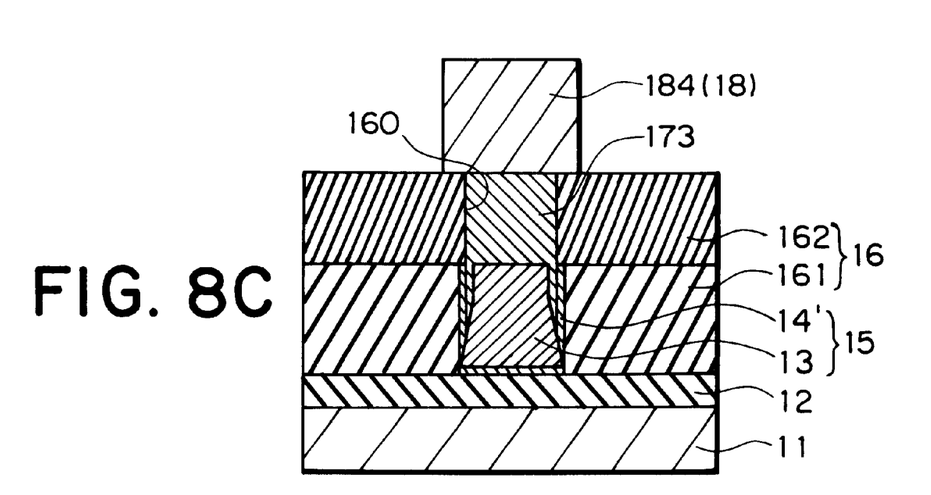

Referring to FIGS. 8A through 8C, description will be made about a third embodiment of this invention which in another modification of the first embodiment. In the first embodiment, the tungsten film is used as the high-melting-point metal film 14. In this embodiment, a titanium nitride film 14' is used as the high-melting-point metal film. Except the above, the steps in this embodiment are substantially similar to those described in conjunction with the first embodiment until the through hole 160 is formed. In the first embodiment, the Al alloy film 13 and the tungsten film 14 are successively polished by CMP by the use of the different slurrys. In this embodiment, the titanium nitride 14' can be polished in the manner similar to polishing of the Al alloy film 13, i.e., by the use of the same slurry.

Referring to FIG. 8A, the through hole 160 leading to the first wiring pattern 15 is formed by etching the second intermediate silicon oxide film 162 in the ordinary condition. The titanium nitride film 14' can be etched under the etching condition of the second intermediate silicon oxide film 162 so that, upon overetching of the second intermediate silicon oxide film 162, the titanium nitride film 14' adjacent to the side surface of the Al alloy film 13 is etched also.

Next referring to FIG. 8B, tungsten hexafluoride (WF$_6$) is reduced by the use of monosilane (SiH$_4$) to grow a tungsten film 173 only in the through hole 160. The through hole 160 is thus filled with the tungsten film 173.

As a growing condition of the tungsten film 173, the pressure of 10–30 mTorr, the ratio of SiH$_4$/WF$_6$ between 0.6 and 1.0. and the temperature of the silicon substrate 11 between 200 and 250° C. are selected. Under the above-mentioned condition, the tungsten film 173 does not grow on the second intermediate silicon oxide film 162 but grows on the Al alloy film 13 and the titanium nitride film 14'. Thus, it is possible to form the titanium nitride film 14' only in the through hole 160.

Next referring to FIG. 8C, an Al alloy film 184 is formed by sputtering on the second intermediate silicon oxide film 162. Thereafter, the Al alloy film 184 is patterned in a known manner to serve as the second wiring pattern 18.

In this embodiment also, the contact area between the Al alloy film 13 and the tungsten film 173 is as large as about two times that of the prior art. Therefore, it is possible to assure the reduction of the connection resistance at the through hole 160.

Figure 9A:
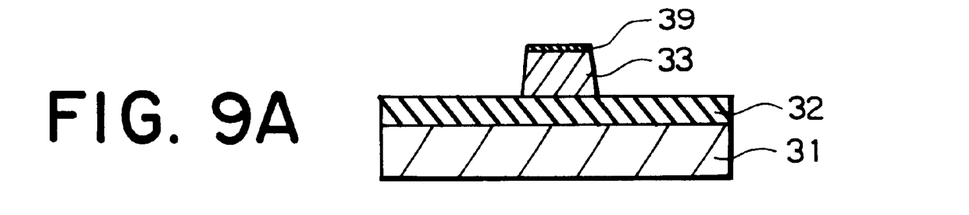
FIGS. 9A through 9C are sectional views for describing a process of manufacturing a semiconductor device according to a fourth embodiment of this invention.
Figure 9B:
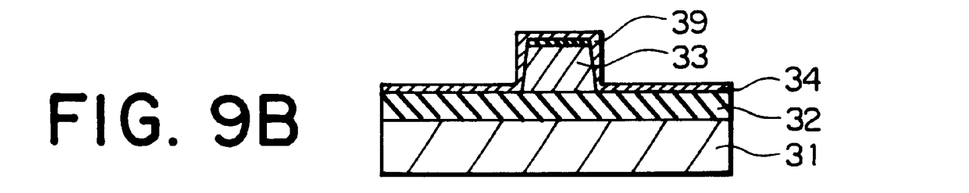
Figure 9C:
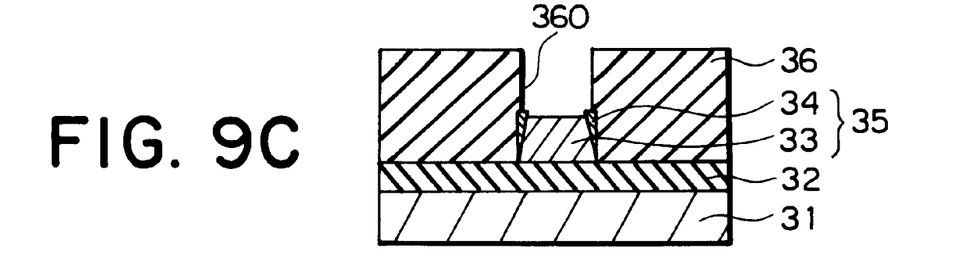

Referring to FIGS. 9A through 9C, a semiconductor device having a multilayered interconnection structure according to a fourth embodiment of this invention will be described.

At first referring to FIG. 9A, a silicon substrate 31 has an upper surface covered with a lower silicon oxide film 32. On the lower silicon oxide film 32, an Al alloy film 33 is formed by sputtering to a thickness between 0.4 and 1.0 μm. Thereafter, a silicon oxide film 39 is formed by plasma CVD to a thickness between 0.2 and 0.3 μm. Then, by ordinary lithography and dry etching, the silicon oxide film 39 is patterned into a shape corresponding to that of the lower wiring pattern. With the silicon oxide film 39 used as an etching mask, the Al alloy film 33 is subjected to dry etching. When a mixture of chlorine ($Cl_2$) and nitrogen ($N_2$) is used as an etching gas for the Al alloy film 33, film deposition occurs on the side surfaces of the Al alloy film 33 during etching. Therefore, the side surfaces of the Al alloy film 33 has a forward-tapered shape of 80–85 degrees.

Subsequently, a TiW film 34 an the high-melting-point metal alloy film is deposited by anisotropic sputtering as illustrated in FIG. 9B. As the anisotropic sputtering, use is made of collimate sputtering in which a collimate plate with a number of apertures is arranged between the sputter target and the substrate. Sputtering particles obliquely incident with respect to the substrate are trapped by the collimate plate while those particles incident in directions generally perpendicular to the substrate are allowed to pass therethrough. Alternatively, long-throw sputtering may be used in which the distance between the sputter target and the substrate is increased as compared with the ordinary sputtering, for examples to be substantially equal to the diameter of the target. The sputtering pressure is selected at 0.5 mTorr or less. With the above-mentioned arrangement, the sputtering particles are generally perpendicularly incident to the substrate substantially without being scattered until they are incident to the substrate. In case where the TiW film 34 is formed by the anisotropic sputtering as described above, the TiW film 34 is at first formed on the forward-tapered portion of the Al alloy film 33. This film gradually grows into an overhanging shape. Once the overhanging shape is developed, the TiW film is no longer formed in the underside. The side wall of the TiW film 34 formed on the side surface of the Al alloy film 33 is perpendicular or slightly overhanging with respect to the upper surface of the lower silicon oxide film 32 (FIG. 9B) when the TiW film 34 is deposited to a thickness between 0.1 and 0.3 μm depending upon the taper angle of the forward-tapered portion.

Thereafter, the TiW film 34 is subjected to anisotropic etching by dry etching using a $CF_4$ gas. As a result, a portion of the TiW film 34 horizontally extending over the lower silicon oxide film 32 is removed to leave the TiW film 34 only on the side surfaces of the Al alloy film 33. A combination of the TiW film 34 and the Al alloy film 33 forms a first wiring pattern 35. The first wiring pattern 35 has side walls generally perpendicular to the upper surface of the lower silicon oxide film 32.

Then, as Illustrated in FIG. 9C, an intermediate silicon oxide film 36 is formed as an interlayer insulator film. Thereafter, a through hole 360 is formed in the intermediate silicon oxide film 36 to lead to the Al alloy film 33. In the manner similar to the other embodiments, the through hole is filled with tungsten and the upper wiring pattern is formed by the Al alloy film. Alternatively, the Al alloy film is formed on the interlayer insulator film by high-temperature sputtering and is filled in the through hole 360. The Al alloy film on the interlayer insulator is patterned to form the upper wiring pattern (not shown).

In the foregoing embodiments, the film of the high-melting-point metal or its compound is formed on the side surfaces of the main wiring metal of the lower wiring pattern. However, it is not essential to deposit the high-melting-point metal film on the side surfaces of the main wiring metal of the lower wiring pattern, as will presently be described in the following.

Figure 10A:
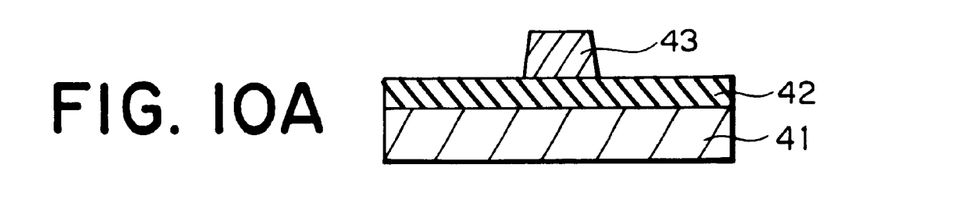
FIGS. 10A and 10B are sectional views for describing a process of manufacturing a semiconductor device according to a fifth embodiment of this invention.
Figure 10B:
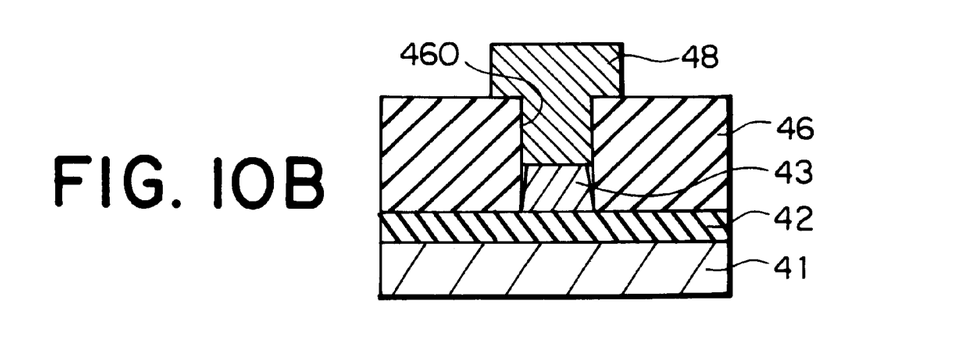

Referring to FIGS. 10A and 10B, a semiconductor device of a multilayered interconnection structure comprises a silicon substrate 41 and a lower silicon oxide film 42 covering the silicon substrate 41. After an Al alloy film 43 as a lower wiring pattern to formed on the lower silicon oxide film 42 so that its side walls have a forward-tapered shape as illustrated in FIG. 10A, an intermediate silicon oxide film 46 is formed as an interlayer insulator film. Thereafter, a through hole 460 is formed in the interlayer insulator film 46 to expose the upper surface of the Al alloy film 43 and a part of the side walls thereof. After an Al alloy film 48 is deposited and the through hole 460 is filled with the Al alloy film 48, the Al alloy film 48 is patterned to form an upper wiring pattern, as illustrated in FIG. 10B.

In this embodiment also, connection between the upper and the lower wiring patterns is achieved not only on the upper surface of the Al alloy film 43 but also on the side walls of the Al alloy film 43. Therefore, a low resistance is achieved. In this embodiment, however, no protection film of a high-melting-point metal is formed on the side walls of the Al alloy film 43. This means that the stress migration characteristic is not improved.

In the foregoing embodiments, the Al alloy is used as the main wiring metal. However, the main wiring metal is not restricted to the Al alloy but may be pure Al, Cu, or a Cu alloy.

As the high-melting-point metal film formed on the side walls of the main wiring metal, use may be made of Ti, Mo and Cr instead of W. As the high-melting-point metal compound film, use may be made of WN, MoN, $WSi_x$, $TiSi_x$, and $TaSi_x$ instead of TiN and TiW. In either event, the similar effect is achieved.

A first advantage of this invention resides in that, even If the through hole becomes finer, the connection resistance at the through hole can be suppressed low and kept stable. Thus, it is possible to further miniaturize the through hole.

This is because the main wiring metal of the lower wiring pattern has a forward-tapered shape with the subsidiary wiring metal formed on the side surfaces of the main wiring metal. With this structure, the lower and the upper wiring patterns are connected via the upper surface of the main wiring metal and the subsidiary wiring metal formed on the side surfaces of the main wiring metal.

A second advantage of this invention resides in that, even if the protection film comprising the high-melting-point metal or its compound is formed on the side surfaces of the main wiring metal, occurrence of leak current or short-circuiting between the wiring patterns is avoided. This make it possible to reduce the line pitch.

This is because the main wiring metal is formed in a forward-tapered shape and the protection film is formed so that the lower wiring pattern as a whole has a width substantially equal to the bottom end of the main wiring metal. Thus, the presence of the protection film does not narrow the line pitch at all.

What is claimed is:

1. A semiconductor device having a multilayered interconnection structure, comprising: a first wiring pattern including a main wiring metal having a forward-tapered cross-section; an interlayer insulator film covering said first wiring pattern and having an opening formed therein to expose at least a part of side walls of said main wiring metal and an upper surface of said main wiring metal; a conductor layer filled in said opening; and a second wiring pattern formed on said interlayer insulator film to be connected to said conductor layer, said opening having a width smaller than that of a bottom end of said main wiring metal.

2. A semiconductor device having a multilayered interconnection structure as claimed in claim 1, wherein said first wiring pattern further comprises a high-melting-point metal film covering the side walls of said main wiring metal, said first wiring pattern having, as a whole, a width substantially equal to that of the bottom end of said main wiring metal.

3. A semiconductor device having a multilayered interconnection structure as claimed in claim 2, wherein said high-melting-point metal film is of a high-melting-point metal selected from the group consisting of Ti, W, Mo, and Cr.

4. A semiconductor device having a multilayered interconnection structure as claimed in claim 1, wherein said first wiring pattern further comprises a high-melting-point metal compound film covering the side walls of said main wiring metal, said first wiring pattern having, as a whole, a width substantially equal to that of the bottom end of said main wiring metal.

5. A semiconductor device having a multilayered interconnection structure as claimed in claim 4, wherein said high-melting-point metal compound film 1is of a high-melting-point metal compound selected from the group consisting of TiN, WN, MoN, TiW, $WSi_x$, $TiSi_x$, $MoSi_x$, and $TaSi_x$.

6. A semiconductor device having a multilayered interconnection structure as claimed in claim 1, wherein said main wiring metal of said first wiring pattern and said opening have a dimensional relationship given by l<S<L where l represents the width of an upper end of said main wiring metal, L, the width of the bottom end of said main wiring metal, and S, the width of a bottom end of said opening.

7. A semiconductor device having a multilayered interconnection structure as claimed in claim 1, wherein said main wiring metal of said first wiring pattern is of a metal selected from the group consisting of Al, an Al alloy, Cu, and a Cu alloy.

8. A semiconductor device having a multilayered interconnection structure, comprising: a first wiring pattern including a main wiring metal having a forward-tapered cross-section; an interlayer insulator film covering said first wiring pattern and having an opening formed therein to expose at least a part of side walls of said main wiring metal and an upper surface of said main wiring metal; and a second wiring pattern formed in said opening and on said interlayer insulator film to be connected to said main wiring metal, said opening having a width smaller than that of a bottom end of said main wiring metal.

9. A semiconductor device having a multilayered interconnection structure as claimed in claim 8, wherein said first wiring pattern further comprises a high-melting-point metal film covering the side walls of said main wiring metal, said first wiring pattern having, as a whole, a width substantially equal to that of the bottom end of said main wiring metal.

10. A semiconductor device having a multilayered interconnection structure as claimed in claim 9, wherein said high-melting-point metal film is of a high-melting-point metal selected from the group consisting of Ti, W, Mo, and Cr.

11. A semiconductor device having a multilayered interconnection structure as claimed in claim 8, wherein said first wiring pattern further comprises a high-melting-point metal compound film covering the side walls of said main wiring metal, said first wiring pattern having, as a whole, a width substantially equal to that of the bottom end of said main wiring metal.

12. A semiconductor device having a multilayered interconnection structure as claimed in claim 11, wherein said high-melting-point metal compound film is of a high-melting-point metal compound selected from the group consisting of TiN, WN, MoN, TiW, $WSi_x$, $TiSi_x$, $MoSi_x$, and $TaSi_x$.

13. A semiconductor device having a multilayered interconnection structure as claimed in claim 8, wherein said main wiring metal of said first wiring pattern and said opening have a dimensional relationship given by l<S<L where l represents the width of an upper end of said main wiring metal, L, the width of the bottom end of said main wiring metal, and S, the width of a bottom end of said opening.

14. A semiconductor device having a multilayered interconnection structure as claimed in claim 8, wherein said main wiring metal of said first wiring pattern is of a metal selected from the group consisting of Al, an Al alloy, Cu, and a Cu alloy.

15. A semiconductor device comprising a first wiring pattern, an interlayer insulator film covering said first wiring pattern and having a through hole leading to said first wiring pattern, and a second wiring pattern formed on said interlayer insulator film to be connected to said first wiring pattern, wherein said first wiring pattern comprises a main wiring metal and a subsidiary wiring metal, said main wiring metal having a forward-tapered cross-section so that said main wiring metal is narrowed in width from a bottom end towards an upper end in a thickness direction thereof, said subsidiary wiring metal covering side surfaces of said main wiring metal and having outer side surfaces substantially parallel to a depth direction of said through hole, said first wiring pattern having, as a whole, a width substantially equal to that of the bottom end of said main wiring metal, said through hole having a width smaller than that of the bottom end of said main wiring metal.

16. A semiconductor device as claimed in claim 15, wherein said semiconductor device further comprises a conductor filled in said through hole to connect said first wiring pattern to said second wiring pattern.

17. A semiconductor device as claimed in claim 16, wherein said conductor includes a part which covers the side surfaces of said main wiring metal and which constitutes a part of said subsidiary wiring metal.

18. A semiconductor device as claimed in claim 15, wherein said second wiring pattern is also formed in said through hole to be connected to said first wiring pattern.

19. A semiconductor device as claimed in claim 18, wherein said second wiring pattern includes a part which covers the side surfaces of said main wiring metal and which constitutes a part of said subsidiary wiring metal.

20. A semiconductor device as claimed in claim 15, wherein said subsidiary wiring metal is of a high-melting-point metal.

21. A semiconductor device as claimed in claim 20, wherein said high-melting-point metal is selected from the group consisting of Ti, W, Mo, and Cr.

22. A semiconductor device as claimed in claim 15, wherein said subsidiary wiring metal is of a high-melting-point metal compound.

23. A semiconductor device as claimed in claim 22, wherein said high-melting-point metal compound is selected from the group consisting of TiN, WN, MoN, TiW, $WSi_x$, $TiSi_x$, $MoSi_x$, and $TaSi_x$.

24. A semiconductor device as claimed in claim 15, wherein said main wiring metal of said first wiring pattern and said through hole have a dimensional relationship given by l<S<L where l represents the width of an upper end of said main wiring metal, L, the width of the bottom end of said main wiring metal, and S, the width of a bottom end of said through hole.

25. A semiconductor device as claimed in claim 15, wherein said main wiring metal of said first wiring pattern is of a metal selected from the group consisting of Al, an Al alloy, Cu, and a Cu alloy.

26. A semiconductor device as claimed in claim 15, wherein the conductive material filling the through hole is the same material as that of the second wiring pattern.

27. A semiconductor device as claimed in claim 15, wherein the conductive material filling the through hole is the same material as that of the subsidiary wiring metal.

28. A semiconductor device as claimed in claim 15, wherein the conductive material filling the through hole, the second wiring pattern, and the subsidiary wiring metal are all made of the same material.

29. A semiconductor device as claimed in claim 1, wherein the first wiring pattern further includes a secondary wiring metal covering side wall of the main wiring metal and having a reverse-tapered cross-section at its inner periphery.

30. A semiconductor device as claimed in claim 29, wherein the reverse-tapered cross-sectional shape of the secondary wiring metal is complementary in shape to the forward-tapered cross-sectional shape of the main wiring metal.

31. A semiconductor device as claimed in claim 8, wherein the first wiring pattern further includes a secondary wiring metal covering side wall of the main wiring metal and having a reverse-tapered cross-section at its inner periphery.

32. A semiconductor device as claimed in claim 31, wherein the reverse-tapered cross-sectional shape of the secondary wiring metal is complementary in shape to the forward-tapered cross-sectional shape of the main wiring metal.

33. A semiconductor device having a multilayered interconnection structure, comprising: a first wiring pattern including a main wiring metal having a forward-tapered cross-section; an interlayer insulator film covering said first wiring pattern and having an opening formed therein to expose at least a part of an upper surface of said first wiring pattern; a conductor layer filled in said opening; and a second wiring pattern formed on said interlayer insulator film to be connected to said conductor layer, said opening having a width substantially equal to that of a bottom end of said main wiring metal.

34. A semiconductor device having a multilayered interconnection structure, comprising: a first wiring pattern including a main wiring metal having a forward-tapered cross-section; an interlayer insulator film covering said first wiring pattern and having an opening formed therein to expose at least a part of an upper surface of said first wiring pattern; and a second wiring pattern formed in said opening and on said interlayer insulator film to be connected to said main wiring metal, said opening having a width substantially equal to that of a bottom end of said main wiring metal.

35. A semiconductor device comprising a first wiring pattern, an interlayer insulator film covering said first wiring pattern and having a through hole leading to said first wiring pattern, and a second wiring pattern formed on said interlayer insulator film to be connected to said first wiring pattern, wherein said first wiring pattern comprises a main wiring metal and a subsidiary wiring metal, said main wiring metal having a forward-tapered cross-section so that said main wiring metal is narrowed in width from a bottom end towards an upper end in a thickness direction thereof, said subsidiary wiring metal covering side surfaces of said main wiring metal and having outer side surfaces substantially parallel to a depth direction of said through hole, said first wiring pattern having, as a whole, a width substantially equal to that of the bottom end of said main wiring metal, said through hole having a width substantially equal to that of the bottom end of said main wiring metal.

* * * * *